US006369594B1

(12) United States Patent
O'Keeffe

(10) Patent No.: US 6,369,594 B1
(45) Date of Patent: Apr. 9, 2002

(54) TEST CLIP FOR ELECTRICAL TESTING OF AN ELECTRONIC COMPONENT

(75) Inventor: Paul O'Keeffe, Cork (IR)

(73) Assignee: EMC Corporation, Hopkinton, MA (US)

( * ) Notice: Subject to any disclaimer, the term of this patent is extended or adjusted under 35 U.S.C. 154(b) by 0 days.

(21) Appl. No.: 09/224,969

(22) Filed: Jan. 4, 1999

(51) Int. Cl.⁷ .............................................. G01R 31/02
(52) U.S. Cl. .................... 324/755; 324/158.1; 439/912; 439/152
(58) Field of Search .............................. 324/755, 158.1; 439/269, 912, 264, 152

(56) References Cited

U.S. PATENT DOCUMENTS

| | | | | |
|---|---|---|---|---|
| 4,996,476 A | * | 2/1991 | Balyasny et al. | 324/158.1 |
| 5,177,436 A | * | 1/1993 | Lee | 324/158.1 |
| 5,453,700 A | * | 9/1995 | Balyasny | 324/755 |
| 5,739,697 A | * | 4/1998 | Balyasny et al. | 324/755 |
| 5,742,170 A | * | 4/1998 | Isaac et al. | 324/755 |

OTHER PUBLICATIONS

Hitex Development Tools, Data Sheet for "KSE5 Adapter for Targets with Surface Mounted AMD Am486/SQFP208 CPU", Jul. 1996.
Shin–Etsu Polymer Co., Ltd., Data Sheet for "Shin–Etsu Inter–Connector GB Type, GB–U Type" (2 sheets) and Technical Information for "GB–U Type", Mar. 23, 1993, pp. 1–10.
Emulation Technology, Inc. "1997 Interconnect Solutions Catalog", 1997, pp. 96–103.

\* cited by examiner

*Primary Examiner*—Safet Metjahic
*Assistant Examiner*—Jimmy Nguyen
(74) *Attorney, Agent, or Firm*—Wolf, Greenfield & Sacks, P.C.

(57) ABSTRACT

A test clip is provided for electrically interfacing an electronic component to test equipment used to electrically test the component and/or an electronic unit incorporating the component. The test clip is readily aligned on and secured to the electronic component to convert the component leads into accessible test points that may be probed or easily connected to the test equipment. The test clip may include one or more replaceable contacts that can be replaced, either individually or in one or more groups, when a contact becomes damaged or worn. The replaceable contacts may include one or more lead contacts that are electrically connected to test point contacts. The lead contacts may be adjustably supported on the test clip so that they can be properly aligned with the component leads. The contacts may also include one or more replaceable interface connectors, which may be provided with a resilient interconnector, for electrically interconnecting the component leads to the lead contacts of the test clip. The test clip may be secured to an electronic component by applying a vacuum to the component body to produce a relatively large holding force therebetween.

39 Claims, 6 Drawing Sheets

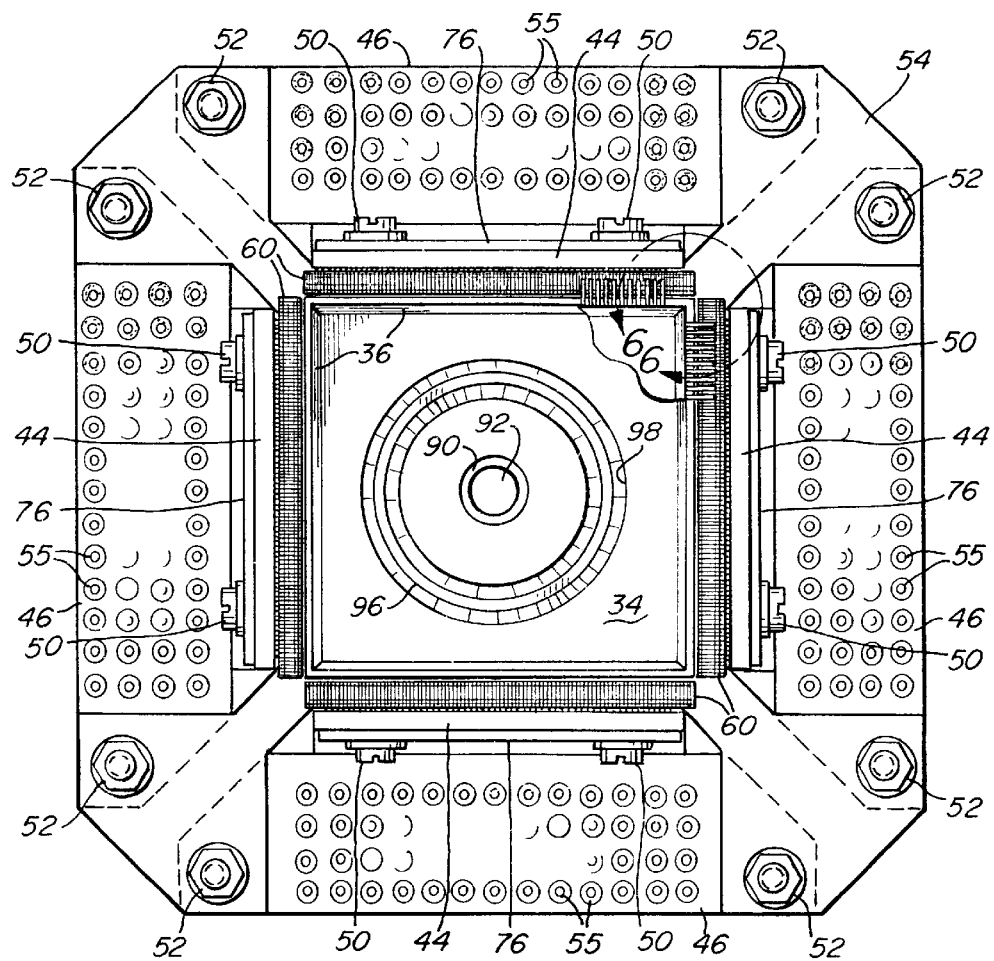
Fig. 5
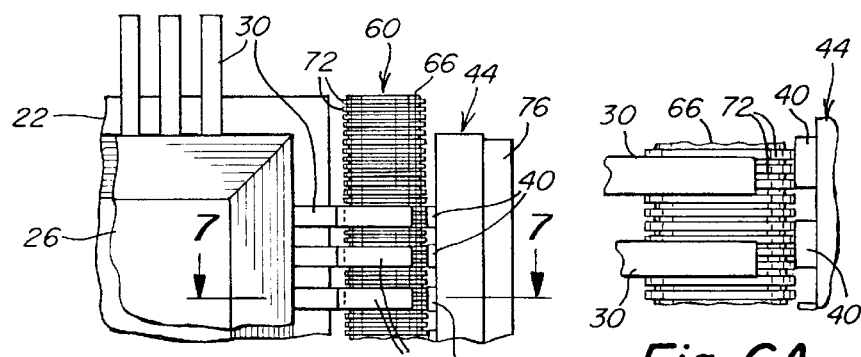
Fig. 6
Fig. 6A

TEST CLIP FOR ELECTRICAL TESTING OF AN ELECTRONIC COMPONENT

BACKGROUND OF THE INVENTION

1. Field of the Invention

The present invention relates to a test clip for electrically testing an electronic component, and more particularly, for testing a board mounted component.

2. Description of Related Art

Test clips are used throughout the electronics industry for electrically testing electronic components, modules, systems and the like. A test clip is typically attached to an electronic component, such as an integrated circuit, that is mounted to a printed circuit board, a substrate or the like. The test clip includes a plurality of contacts that electrically interconnect the leads of the component to more accessible test points on the clip. The test points may be probed and/or connected to test equipment to perform various types of testing, such as debugging and the like, on the component and/or system.

Test clips are available in various shapes and sizes that mate with particular component packages. Test clips are also configured to mate with various lead configurations, including surface mount, through-hole and the like configurations.

In many test environments, a test clip is attached to an electronic component mounted to a vertically oriented printed circuit board. When a large number of wires is connected to the test clip, particularly when testing high pin count devices, the sheer mass of the wires may cause undesirable shifting of the test clip relative to the component resulting in a misalignment between the test clip contacts and the component leads. In some situations, the weight of the wires may result in separation between the test clip and the component, thereby interrupting the electrical interconnections therebetween.

One proposed solution for securing a test clip to an electronic component includes providing a fastener on the component body that is used to attach the test clip thereto. For example, a threaded stud may be bonded to the component body so that it extends through an aperture on the test clip when the test clip is seated on the component. The test clip is then secured to the component with a fastener, such as a nut, that mates with the stud.

Applicant has recognized that known test clips suffer from several drawbacks. For example, test clips used to test high density component packages are relatively expensive devices due to the particular manufacturing processes and close tolerances necessary to produce the test clip. In addition to their high cost, such test clips are prone to being damaged from repetitive use and handling. Once damaged, a test clip is typically discarded since it cannot be repaired. Consequently, a test clip may have a very short useful life in a typical test environment.

Another exemplary drawback involves the mounting scheme described above. This technique requires that a fastener be attached to a component body with an adhesive prior to testing and subsequently removed from the component body upon completion of the testing. Such an arrangement may be undesirable in a manufacturing environment due to the amount of time needed both to attach and to remove the fastener. This arrangement may also increase the potential risk of damage to the component.

It is an object of the present invention to provide an improved test clip for electrically testing an electronic component.

SUMMARY

In one illustrative embodiment of the invention, a test clip is provided for electrical testing of an electronic component including a component body and plurality of component leads disposed on the component body. The test clip comprises a base that is constructed and arranged to support the test clip on the electronic component, and a plurality of replaceable contacts detachably supported by the base. The contacts are constructed and arranged to electrically interface with the plurality of component leads when the base is placed on the component body.

In another illustrative embodiment of the invention, a test clip is provided for electrical testing of an electronic component including a component body and plurality of component leads disposed on the component body. The test clip comprises a base constructed and arranged to apply a vacuum from a vacuum source to the component body to secure the test clip to the electronic component, and a plurality of contacts supported by the base to interface with the plurality of component leads when the base is placed on the component body.

In a further illustrative embodiment of the invention, a test apparatus is provided comprising a test clip that is attachable to an electronic component including a plurality of component leads, and a test board for electrically testing the test clip. The test clip includes a base and a plurality of contacts adjustably supported on the base to electrically interface with the plurality of component leads when the test clip is attached to the electronic component. The test board is constructed and arranged to be coupled to the test clip to electrically check alignment of the contacts for electrically interfacing with the plurality of component leads.

BRIEF DESCRIPTION OF THE DRAWINGS

The foregoing and other objects and advantages of the present invention will become apparent with reference to the following detailed description when taken in conjunction with the accompanying drawings in which:

FIG. 5 is a bottom plan view of the test clip of FIGS. 1–4 taken along view line 5—5 of FIG. 4;

FIG. 6 is an enlarged fragmentary view of region 6—6 of FIG. 5;

FIG. 6A is a fragmented schematic view of FIG. 6 illustrating misalignment between the test contacts and the component leads;

DETAILED DESCRIPTION

The present invention is directed to a test clip for electrically interfacing an electronic component to test equipment used to electrically test the component and/or an electronic unit incorporating the component. The test clip is readily aligned on and secured to the electronic component to convert the component leads into accessible test point contacts that may be probed or easily connected to the test equipment. The test clip has a modular configuration resulting in a relatively inexpensive test clip capable of providing a test interface for high density electronic components. The test clip may be easily repaired to substantially increase its useful life.

The test clip may include one or more replaceable contacts that can be replaced, either individually or in one or more groups, when a contact becomes damaged or worn. The replaceable contacts may include one or more lead contacts that are electrically connected to the test point contacts. The lead contacts may be adjustably supported on the test clip so that they can be properly aligned with the component leads. The contacts may also include one or more replaceable interface connectors, which may be provided with a resilient interconnector, for electrically interconnecting the component leads to the lead contacts of the test clip.

The test clip may be secured to an electronic component by applying a vacuum to the component body to produce a relatively large holding force therebetween. This arrangement is particularly suited for testing an electronic component that requires a large number of wires attached to the test clip which could otherwise cause the test clip to shift relative to the component resulting in misaligned and/or shorted contacts and leads.

Figure 1:
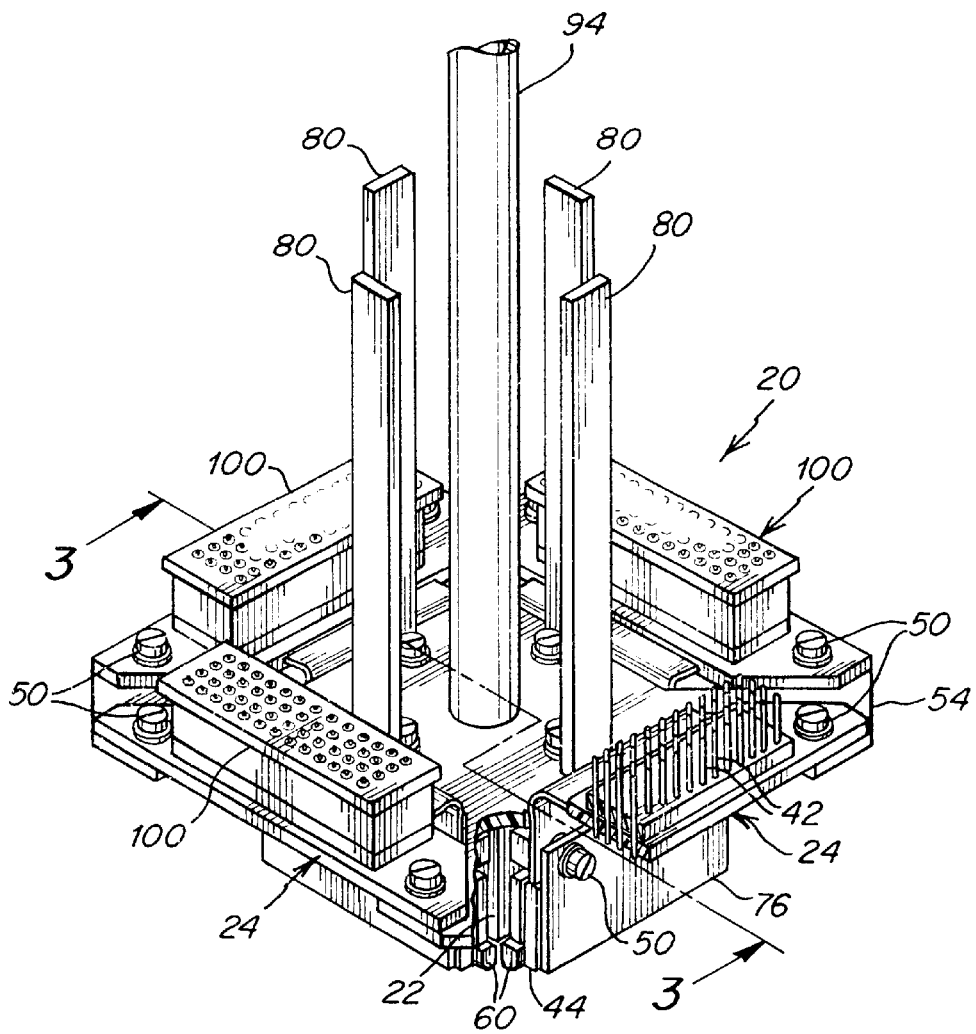
FIG. 1 is a partially fragmented perspective view of a test clip according to one illustrative embodiment of the invention.
Figure 1:
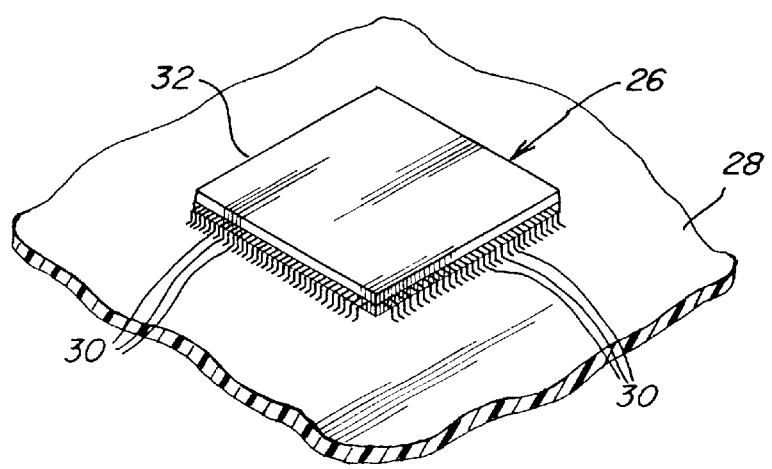
Figure 2:
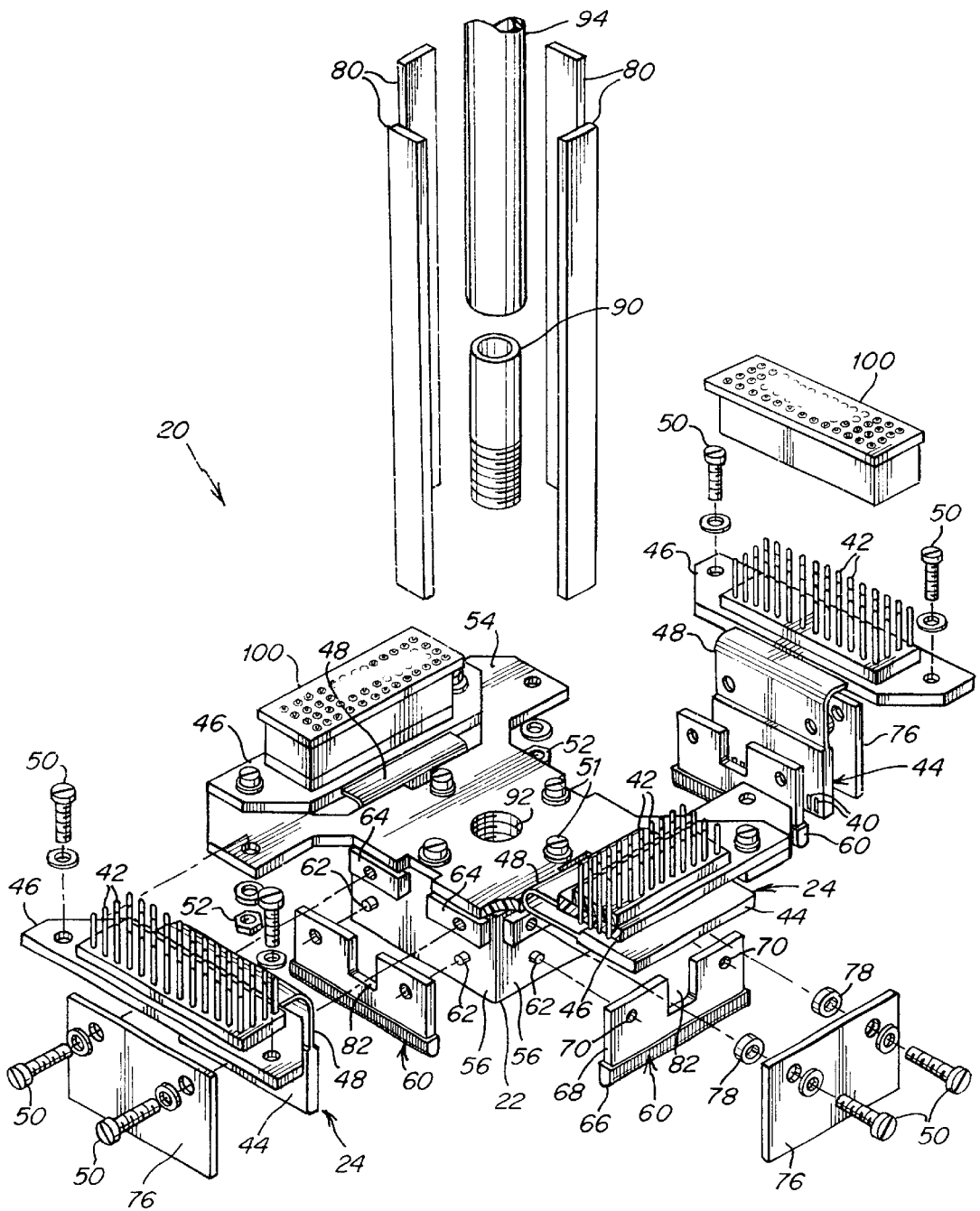
FIG. 2 is a partially fragmented exploded perspective view of the test clip of FIG. 1.

In one illustrative embodiment of the invention as shown in FIGS. 1–8, the test clip 20 includes a base 22 and one or more test connectors 24 supported by the base. The base 22 is configured to position each test connector 24 adjacent the leads of an electronic component when the test clip is placed on the component. In one embodiment as shown in FIG. 1, the test clip 20 is configured to interface with a quadrilateral component 26, such as a square quad flatpack (QFP), mounted to a printed circuit board 28. The test clip 20 includes four test connectors 24 that are arranged to interface with the component leads 30 located along each side of the component body 32. It is to be appreciated, however, that the test clip may be configured with any number of test connectors to interface with any electronic component configuration including, but not limited to, QFP, LCC, SOIC, DIP or other device packages.

The base 22 may be configured to position and align the test connectors 24 with the component leads 30 as the test clip is being seated on the component. In one illustrative embodiment shown in FIGS. 3–5, the base 22 includes a cavity 34 in a lower portion thereof for receiving at least a portion of the electronic component 26 therein to locate the test clip on the component. The cavity 34 may be configured with one or more cam surfaces that coact with the component body to facilitate alignment between the test connectors and the component leads. In one embodiment, the cavity 34 is configured with angled sides 36 that substantially match the profile of the component body 32 to readily align the test clip on the component. The base 22 may be formed from an anti-static plastic material, such as DELRIN or the like. Of course, the base may be formed from any suitable material using any suitable process.

Each test connector 24 includes one or more lead contacts 40 at a first end thereof that electrically interface with a corresponding component lead 30 when the test clip is seated on the electronic component. Each test connector 24 also includes one or more test point contacts 42 at a second end thereof that are electrically interconnected to a respective lead contact 40. The lead contacts 40 may be provided on a lead connector 44 and the test point contacts 42 may be provided on a test point connector 46. The connectors 44, 46 may be interconnected with a flexible cable 48 allowing the test point contacts to be readily positioned in a desirable orientation relative to the lead contacts. For example, as shown in the figures, the lead connector 44 may be oriented approximately 90° relative to the test point connector 46. It is to be understood, however, that the test clip is not limited to this particular orientation.

The test connectors 24 may be attached to the base 22 using removable fasteners, such as screws 50 and nuts 52, to allow one or more of the test connectors to be removed and replaced should they become damaged or worn. As illustrated, each test point connector 46 is mounted to a support plate 54 secured to the upper surface of the base 22 using one or more fasteners 51, such as screws or the like. The lower portion of the flexible cable 48 above the lead connector 44 is secured to the base side wall 56 so that the lead connector 44 may be permitted some degree of movement relative to the base as described in more detail below. It is to be appreciated, however, that the test connectors 24 may be mounted to the base 22 in any suitable manner that permits their replacement.

As shown, the test connectors 24 are secured to the base 22 with the test point contacts being supported in readily accessible locations and positions that can be easily connected to test equipment. Additionally, the test connectors 24 convert the component leads 30 to test point contacts 42 having a configuration that is more conducive for testing. In one exemplary embodiment, each test connector 24 is configured to convert a component lead pitch of 0.5 mm (approximately 0.02 inches) to a test point contact pitch of 0.1 inches. The test clip is configured to interface with a 208-pin QFP with each test connector including fifty-two (52) lead contacts and test point contacts. It is to be appreciated, however, that each test connector may include any number of lead contacts and/or test point contacts configured in any suitable manner for interfacing with the particular electronic component.

Figure 8:
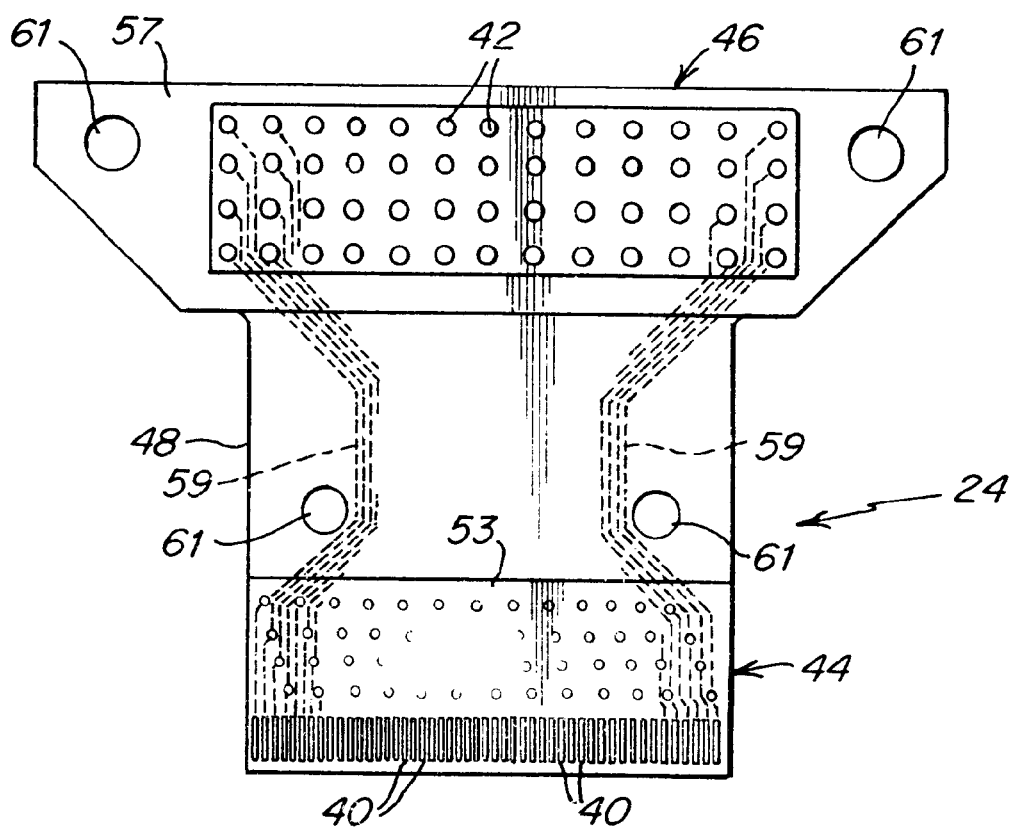
FIG. 8 is a schematic view of a test connector according to one illustrative embodiment of the invention.

In one illustrative embodiment best shown in FIG. 8, each test connector 24 is comprised of a flexible printed circuit 48 interconnecting the lead connector 44 and the test point connector 46 at each end thereof. The lead and test point connectors 44, 46 may include printed circuit boards that are integrally formed with the flexible printed circuit 48. The lead contacts 40 may include edge finger contacts formed on a lead connector circuit board 53 and the test point contacts 42 may include post contacts that are soldered to plated-through holes 55 (FIG. 5) formed on the test point circuit board 57. Each lead contact 40 is electrically interconnected to a corresponding test point contact 42 via a circuit 59 formed in the flexible printed circuit 48. One or more holes 61 may be provided in the flexible printed circuit 48 and the test point circuit board 57 for mounting the test connector to the body 22 and the support plate 54. This configuration allows the test connector to be formed using relatively inexpensive, standard manufacturing techniques. It is to be understood, however, that the test connector 24 may be formed with any suitable processes using any suitable components. For example, the test connector may include separate connectors that are interconnected with a flexible cable and/or individual wires.

The test clip 20 may also include a interface connector for mechanically and electrically interfacing the lead contacts 40 of each test connector with the component leads 30 when the test clip is placed on the electronic component. In one illustrative embodiment more clearly shown in FIG. 7, an interface connector 60 is supported between the base side wall 56 and the lead connector 44 of each test connector on a pair of pins 62 protruding from the side wall. This arrangement allows the interface connector 60 to be readily replaced when it becomes damaged or worn from repetitive use, handling or the like. The base 22 may include one or more spacers 64 for mounting the test connector 24 a predetermined distance from the base side wall 56 to retain the interface connector on the pins while allowing a limited amount of interface connector movement therebetween as described more fully below.

In one illustrative embodiment, the interface connector 60 includes a resilient interconnector 66 that is supported at the end of a support member 68 adjacent the lead contacts 40. The support member 68 may include a pair of holes 70 that are adapted to receive the pins 62 therein for mounting the interface connector thereon. The interconnector 66 is compressed between the component leads 30 and the lead contacts 40 when the test clip is placed on the electronic component to ensure a positive contact between each lead contact and component lead. In one embodiment, the relative diameter of the holes 70 to the pins 62 allows the resilient interconnector 66 to float relative to the lead contacts 40.

The resilient interconnector 66 may include a plurality of conductive filaments 72 that are wrapped about at least a portion of a core 74 of resilient material. As shown in FIGS. 5–6A, the size and spacing of the filaments 72 may be selected to ensure that a plurality of filaments interconnects each lead contact 40 to its corresponding component lead 30. This configuration helps establish an electrical connection between misaligned lead contacts 40 and component leads 30 (FIG. 6A) while reducing the possibility of creating short circuits between adjacent leads and/or contacts, which may be particularly beneficial for small lead pitch devices. The interconnector 66 may also maintain an electrical connection between the lead contacts 40 and the component leads 30 should one or more individual filaments 72 become damaged or worn.

Figure 3:
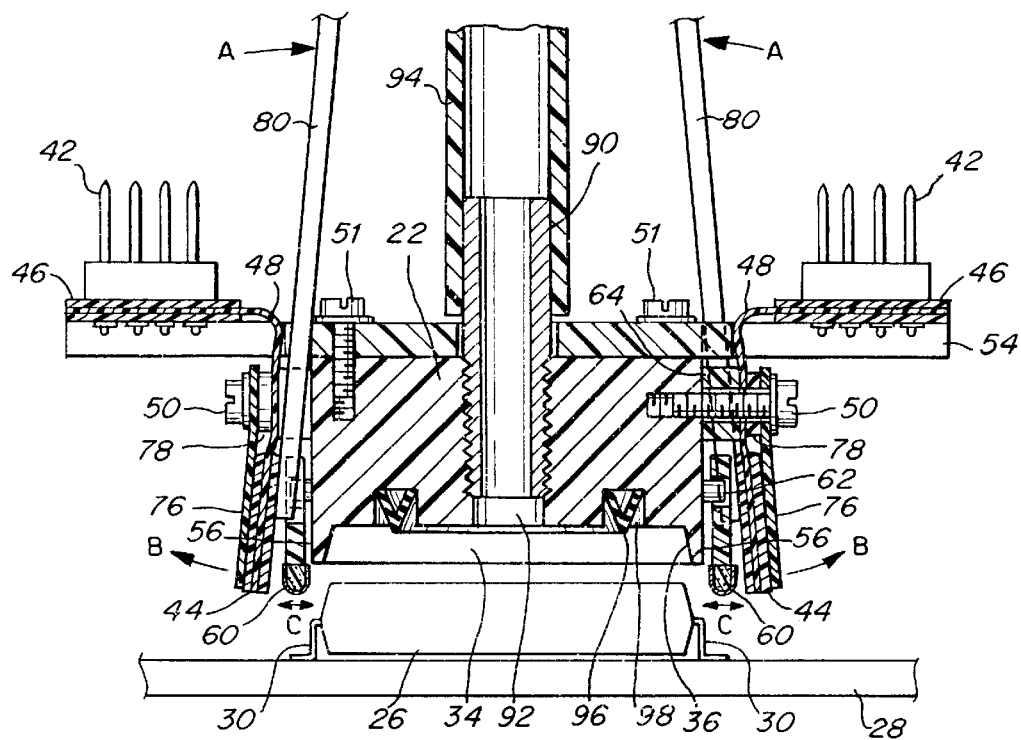
FIG. 3 is a cross-sectional view taken along section line 3—3 of FIG. 1 illustrating the test clip being opened for placement onto an electronic component.
Figure 4:
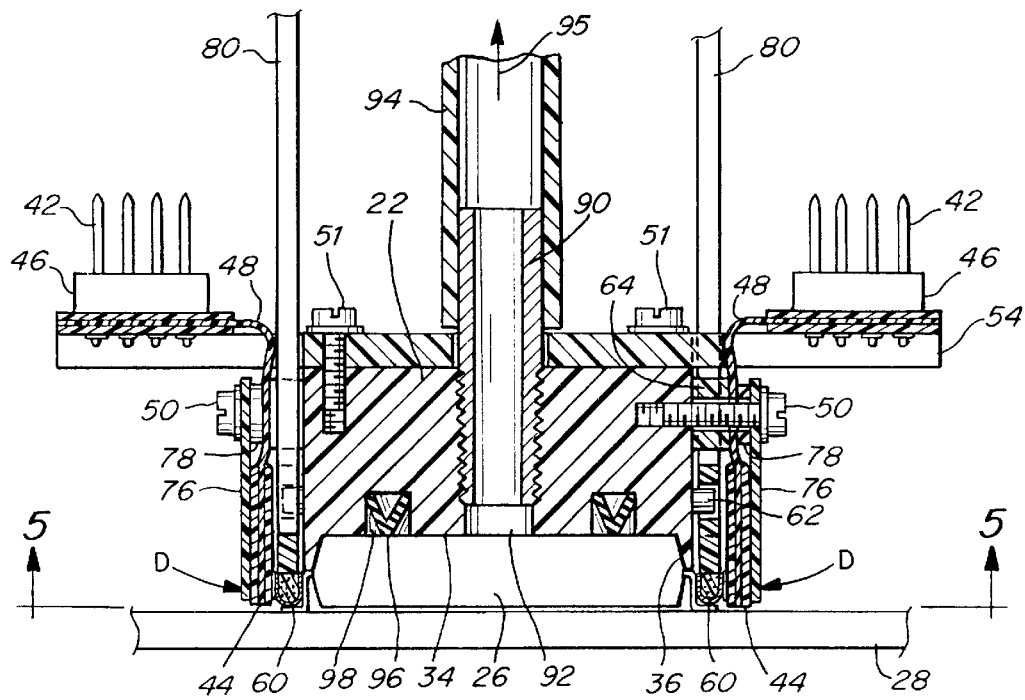
FIG. 4 is similar to FIG. 3 illustrating the test clip seated on the electronic component with the test contacts engaging the leads of the electronic component.
Figure 7:
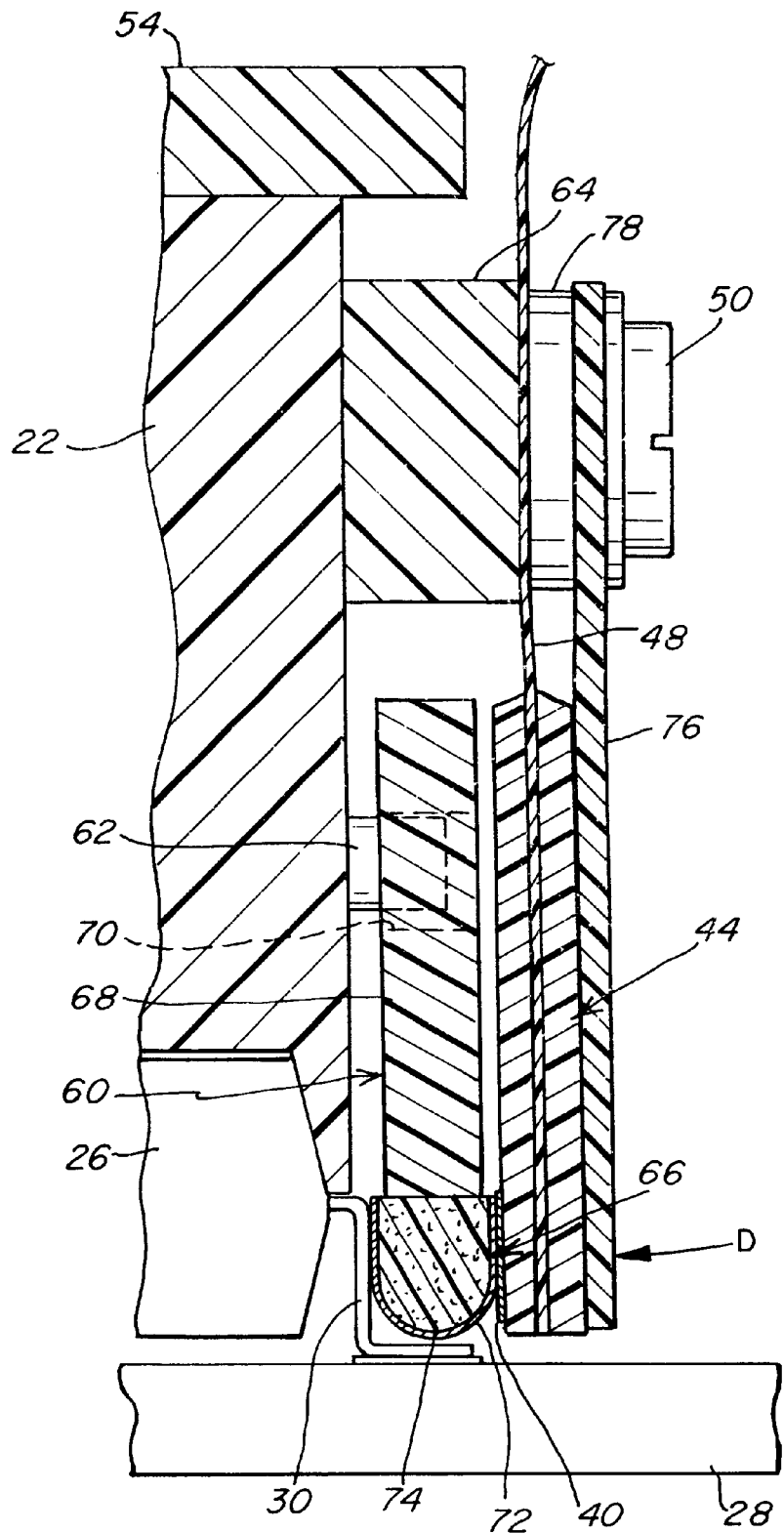
FIG. 7 is an enlarged cross-sectional view taken along section line 7—7 of FIG. 6.

In one embodiment shown in FIGS. 3, 4 and 7, the conductive filaments 72 are substantially U-shaped wires wrapped about a core 74 of an elastomeric material, such as silicone sponge rubber or the like. One example of a material particularly suitable for the resilient interconnector is available from Shin-Etsu Polymer America Inc. of Union City, California, part no. GB-U type. The support member 68 may be formed of a plastic material, such as grade FR-4 glass epoxy. The resilient interconnector 66 may be bonded to the edge of the support member 68 using a suitable adhesive, such as a silicon based adhesive. It should be understood, however, that the interface connector may be formed in any desirable configuration using any suitable materials and processes.

Each lead connector 44 may be biased inwardly toward the component leads 30 to enhance the electrical connections between the lead contacts 40 and the component leads 30 when the test clip is placed on the electronic component. In one illustrative embodiment, a cantilever spring 76 is mounted on the base 22 and extends downwardly adjacent the lead connector 44 to bias the lead contacts 40 inwardly toward the connector interface 60. The spring 76 may be secured to the base 22 together with the test connector, as shown, or separately using any suitable fastener, such as a screw, that allows replacement of the spring. One or more spacers 78 may be disposed between the spring 76 and the test connector 24 so that the position of the spring relative to the lead connector 44 may be selected to establish a desired amount of bias against the connector. In one embodiment, the spring is formed from a sheet of glass epoxy, grade FR-4, having a thickness of approximately 0.05 inches. It is to be appreciated, however, that the test clip may use any suitable spring configuration formed from any suitable material.

To facilitate placement on an electronic component, the test clip 20 may include one or more levers 80 for actuating each test connector 24 toward an open position. In one illustrative embodiment shown in FIGS. 1–4, each lever 80 includes an elongated member that is inserted into the test clip between a base side wall 56 and its corresponding test connector 24. As the upper portion of the lever 80 is squeezed inwardly (indicated as A in FIG. 3) toward the center of the test clip, the lower portion of the lever pivots outwardly against the lead connector 44 causing the lead connector to flex outwardly (indicated as B) away from the interface connector 60. With the test connector 24 in the open position, the interface connector 60 is free to move relative to the lead connector 44 (indicated as C) so that the test clip may be readily placed on the electronic component. When the test clip 20 is seated on the component, each lever 80 is released allowing the spring 76 to urge the respective lead connector 44 inwardly (indicated as D in FIG. 4) against the interface connector 60 which in turn is pressed against the component leads 30. It should be appreciated, however, that levers are not required for the test clip. For example, the test connectors may be configured to expand outwardly as they engage the component leads when the test clip is being seated on the electronic component.

As illustrated, each lever 80 is detachable from the test clip 20 so that it can be readily removed when the test clip is seated on the electronic component. Each interface connector 60 includes an elongated recess 82 at its upper portion for slidably receiving the end of the lever therein. The recess 82 allows the end of the lever to be positioned adjacent the lower portion of the lead connector 44 to increase the amount of leverage that may be exerted against it. Removal of the levers 80 may be useful during testing to avoid potential interference between the levers and any interconnections from the test clip to the test equipment. It is to be understood, however, that the levers, if provided, need not be removable from the test clip. Additionally, rather than multiple levers, the test clip may be provided with a single lever that is coupled to and actuates one or more of the test connectors.

The test clip 20 may be configured to be securely attached to the electronic component 26 during testing to substantially reduce the amount of potential shifting between the lead contacts 40 and the component leads 30. In one illustrative embodiment, the test clip 20 includes a vacuum port that is to be coupled to a vacuum source for applying a vacuum that holds the test clip securely against the component body. The test clip may be readily detached from the component by interrupting the vacuum.

As shown in FIGS. 1–4, the vacuum port includes a fitting 90 that is coupled to a borehole 92 extending through the base 22 and into the cavity 34. A vacuum tube 94 may be attached to the fitting 90 to fluidly couple the test clip 20 to the vacuum source so that a vacuum 95 (FIG. 4) may be drawn through the test clip and applied to the portion of the component body 32 received within the cavity 34. A vacuum seal 96 may be disposed in an annular recess 98 surrounding the borehole 92 to engage and maintain the vacuum against the surface of the component. In one embodiment, the vacuum seal 96 is a V-seal formed of a resilient material, such as silicone rubber or other elastomer. It is to be appreciated that any suitable seal, such as an O-ring or the like, may be implemented with the test clip for maintaining a vacuum between the component body and the test clip.

A vacuum pump (not shown) may be provided to draw a vacuum that is sufficient to secure the test clip 20 to the component body 32. In one embodiment, the vacuum pump is capable of drawing a vacuum of approximately 26" Hg (inches of mercury). One example of a vacuum pump that may be suitable for implementation with the test clip is a Busch dry running rotary vane vacuum pump, Type SV1003, manufactured by Busch GmbH of Maulburg, Germany.

The test clip may be self tested to ensure that each test connector is properly adjusted so that the lead contacts align with the component leads when the test clip is seated on the electronic component. In one embodiment, a test board, similar to the printed circuit board 28 and electronic component 26 as shown in FIG. 1, may be provided to electrically check the test clip. Rather than an active electronic component, however, the test board may include an inactive or dummy test component mounted thereon that includes a plurality of test leads configured to simulate the component leads.

Self test connectors 100 may be provided to mate with each test point connector 46 and interconnect the lead contacts 40 in a predetermined pattern. The board 28 may be configured to interconnect the test leads 30 of the test component in a similar, but staggered, pattern so that one or more test circuits may be established when the lead contacts 40 are interconnected with the test component leads 30. For example, the test board and connectors may be configured to interconnect each of the odd numbered (1, 3, 5, etc.) lead contacts and separately interconnect each of the even numbered (2, 4, 6, etc.) lead contacts.

When the lead contacts 40 of the test clip are properly aligned with the test component leads 30, two or more uninterrupted test circuits are established through the test clip and test board. When the lead contacts are misaligned with the test component leads, one or more of the test circuits will be interrupted (open) or shorted to each other. A pair of electrical signals, such as an odd signal and an even signal, may be input to the test clip and monitored by the test board to determine whether one or more of the lead contacts 40 are properly aligned for testing an electronic component. When a lead connector 44 is misaligned, it may be loosened from the base 22 and easily adjusted relative to the test component until the test board indicates that the lead contacts are properly aligned with the component leads.

It should be understood that the self test arrangement described above is exemplary and the present invention is not limited thereto. The test clip may be tested and/or adjusted using any suitable test method and apparatus.

As should be apparent from the foregoing description and the accompanying figures, the present invention is directed to an improved test clip for electrically testing an electronic component, such as an integrated circuit. The test clip may include one or more modular component parts that can be easily replaced when damaged or worn. This modularity provides a repairable test clip comprised of relatively inexpensive component parts manufactured with standard tolerances using standard processes. The test clip may be configured to be secured to the electronic component by applying a vacuum between the test clip and the component body.

Having described several embodiments of the invention in detail, various modifications and improvements will readily occur to those skilled in the art. Such modifications and improvements are intended to be within the spirit and scope of the invention. Accordingly, the foregoing description is by way of example only and is not intended as limiting. The invention is limited only as defined by the following claims and their equivalents.

What is claimed is:

1. A test clip for electrical testing of an electronic component including a component body and plurality of component leads disposed on the component body, the test clip comprising:

a base that is constructed and arranged to support the test clip on the electronic component, the base including a vacuum port that is attachable to a vacuum source to apply a vacuum to the component body to secure the test clip to the electronic component; and a plurality of replaceable contacts detachably supported by the base, the contacts being constructed and arranged to electrically interface with the plurality of component leads when the base is placed on the component body.

2. The test clip according to claim 1, wherein the plurality of replaceable contacts includes a plurality of lead contacts that are constructed and arranged to align with the plurality of component leads when the base is placed on the component body.

3. The test clip according to claim 2, wherein the plurality of replaceable contacts further includes a plurality of test point contacts electrically interconnected to the plurality of lead contacts.

4. The test clip according to claim 3, further comprising at least one flexible printed circuit, the plurality of lead contacts being disposed at a first end of the flexible printed circuit and the plurality of the test point contacts being disposed at a second end of the flexible printed circuit, the flexible printed circuit including a plurality of circuits interconnecting the plurality of lead contacts to the plurality of test point contacts.

5. The test clip according to claim 3, further comprising at least one test connector, the plurality of lead contacts and the plurality of test point contacts being disposed on the test connector.

6. The test clip according to claim 5, wherein the test connector includes a lead contact connector, the plurality of lead contacts being disposed on the lead contact connector.

7. The test clip according to claim 6, wherein the test connector includes a test point connector, the plurality of test point contacts being disposed on the test point connector.

8. The test clip according to claim 7, wherein test connector includes a flexible cable interconnecting the lead contact connector to the test point connector.

9. The test clip according to claim 1, wherein the base has a cavity that is adapted to receive at least a portion of the component body therein to locate the test clip on the electronic component.

10. The test clip according to claim 9, wherein the body includes at least one cam surface defining the cavity to coact with the component body to align the plurality of contacts with the plurality of component leads.

11. A test clip for electrical testing of an electronic component including a component body and plurality of component leads disposed on the component body, the test clip comprising:

a base that is constructed and arranged to support the test clip on the electronic component;

a plurality of replaceable contacts detachably supported by the base, the contacts being constructed and arranged to electrically interface with the plurality of component leads when the base is placed on the component body, the plurality of replaceable contacts including a plurality of lead contacts that are constructed and arranged to align with the plurality of component leads when the base is placed on the component body and a plurality of test point contacts electrically interconnected to the plurality of lead contacts; and at least one flexible printed circuit, the plurality of lead contacts being disposed at a first end of the flexible printed circuit and the plurality of the test point contacts being disposed at a second end of the flexible printed circuit, the flexible printed circuit including a plurality of circuits interconnecting the plurality of lead contacts to the plurality of test point, the flexible printed circuit including a first circuit board, the lead contacts being disposed on the first circuit board.

12. The test clip according to claim 11, wherein the plurality of lead contacts include a plurality of edge finger contacts formed along an edge of the first circuit board.

13. The test clip according to claim 11, wherein the flexible printed circuit further includes a second circuit board, the test point contacts being disposed on the second circuit board.

14. The test clip according to claim 11, wherein the first circuit board is movably mounted to the base.

15. The test clip according to claim 14, wherein the first circuit board is adjustably supported on the base to position the plurality of lead contacts in alignment with the plurality of component leads.

16. The test clip according to claim 14, wherein the first circuit board is movable between a first position to allow the test clip to be placed on the electronic component and a second position to electrically couple the plurality of lead contacts with the component leads.

17. The test clip according to claim 16, wherein the first circuit board is biased toward the second position.

18. The test clip according to claim 17, further comprising at least one spring supported on the base adjacent the first circuit board to urge the first circuit board toward the second position.

19. The test clip according to claim 18, wherein the spring includes a cantilever spring.

20. The test clip according to claim 18, wherein the spring is replaceable.

21. The test clip according to claim 16, further comprising at least one lever coupled to the first circuit board to move the first circuit board toward the first position when the lever is actuated.

22. The test clip according to claim 21, wherein the at least one lever is detachably supported on the base.

23. A test clip for electrical testing of an electronic component including a component body and plurality of component leads disposed on the component body, the test clip comprising:

a base that is constructed and arranged to support the test clip on the electronic component; and a plurality of replaceable contacts detachably supported by the base, the contacts being constructed and arranged to electrically interface with the plurality of component leads when the base is placed on the component body, the plurality of replaceable contacts including a plurality of lead contacts that are constructed and arranged to align with the plurality of component leads when the base is placed on the component body, the plurality of replaceable contacts further including a plurality of interface contacts detachably mounted to the base adjacent the plurality of lead contacts, the interface contacts being constructed and arranged to interface the lead contacts with the component leads when the test clip is placed on the electronic component.

24. The test clip according to claim 23, further comprising at least one interface connector detachably mounted to the base, the plurality of interface contacts being disposed on the interface connector.

25. The test clip according to claim 24, wherein the interface connector includes a resilient interconnector that is constructed and arranged to be compressed between the lead contacts and the component leads when the test clip is placed on the electronic component, the plurality of interface contacts being disposed on the resilient interconnector.

26. The test clip according to claim 24, wherein the interface connector is movably supported on the base.

27. A test clip for electrical testing of an electronic component including a component body and plurality of component leads disposed on the component body, the test clip comprising:

a base that is constructed and arranged to support the test clip on the electronic component;

a plurality of replaceable contacts detachably supported by the base, the contacts being constructed and arranged to electrically interface with the plurality of component leads when the base is placed on the component body; and at least one lever coupled to the plurality of contacts to, when actuated, move the contacts toward a first position to allow the test clip to be placed on the electronic component.

28. A test clip for electrical testing of an electronic component including a component body and plurality of component leads disposed on the component body, the test clip comprising:

a base constructed and arranged to apply a vacuum from a vacuum source to the component body to secure the test clip to the electronic component; and a plurality of contacts supported by the base to interface with the plurality of component leads when the base is placed on the component body.

29. The test clip according to claim 28, wherein the base has a vacuum port that is attachable to the vacuum source.

30. The test clip according to claim 29, wherein the base includes a vacuum seal disposed about the vacuum port to engage a surface of the component body.

31. The test clip according to claim 30, wherein the base has an annular recess surrounding the vacuum port, the vacuum seal being disposed within the recess.

32. The test clip according to claim 30, wherein the base has a cavity that is adapted to receive at least a portion of the component body therein.

33. The test clip according to claim 32, wherein the vacuum port is fluidly coupled to the cavity.

34. The test clip according to claim 32, wherein the vacuum seal is disposed within the cavity.

35. A test apparatus comprising:

a test clip that is attachable to an electronic component including a plurality of component leads, the test clip including a base and a plurality of contacts adjustably supported on the base to electrically interface with the plurality of component leads when the test clip is attached to the electronic component; and a separate test board constructed and arranged to be coupled to the test clip to electrically check alignment of the contacts for electrically interfacing with the plurality of component leads.

36. The test apparatus according to claim 35, further comprising at least one self test connector that is attachable to the test clip to interconnect the contacts in a predetermined pattern.

37. The test apparatus according to claim 36, wherein the plurality of contacts includes a plurality of lead contacts that are constructed and arranged to be aligned with the component leads when the test clip is placed on the electronic component and a plurality of test point contacts that are electrically connected to the lead contacts, the self test connector adapted to be mated with the test point contacts to interconnect the lead contacts in the predetermined pattern.

38. The test apparatus according to claim 35, wherein the test board includes a plurality of test leads configured to simulate the plurality of component leads.

39. The test apparatus according to claim 38, wherein the test leads are interconnected in a predetermined pattern to establish at least one test circuit when the plurality of contacts are interconnected with the plurality of test leads.

* * * * *